(12) United States Patent
Kikuchi et al.

(10) Patent No.: US 12,453,166 B2
(45) Date of Patent: Oct. 21, 2025

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Kenji Kikuchi, Komatsu Ishikawa (JP); Tsuyoshi Kachi, Kanazawa Ishikawa (JP); Shotaro Baba, Kanazawa Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 356 days.

(21) Appl. No.: 18/084,445

(22) Filed: Dec. 19, 2022

(65) Prior Publication Data

US 2023/0378340 A1    Nov. 23, 2023

(30) Foreign Application Priority Data

May 20, 2022    (JP) .................. 2022-083080

(51) Int. Cl.
*H10D 84/00* (2025.01)
*H10D 30/01* (2025.01)
(Continued)

(52) U.S. Cl.
CPC ....... *H10D 84/146* (2025.01); *H10D 30/0297* (2025.01); *H10D 30/668* (2025.01); *H10D 64/117* (2025.01)

(58) Field of Classification Search
CPC .... H10D 62/393; H10D 64/01; H10D 84/017; H10D 84/85; H10D 62/124; H10D 30/60
See application file for complete search history.

(56) References Cited

U.S. PATENT DOCUMENTS

2009/0278166 A1    11/2009    Soeno et al.
2010/0117117 A1*    5/2010    Ruething ............. H10D 12/038
                                                                257/E29.066
(Continued)

FOREIGN PATENT DOCUMENTS

CN    104051524 A    *    9/2014    ........... H10D 12/441
JP    2004-006664 A        1/2004
(Continued)

OTHER PUBLICATIONS

Office Action issued in Japanese Patent Application No. 2022-083080, dated Jul. 2, 2025 in 15 pages.
(Continued)

*Primary Examiner* — Syed I Gheyas
(74) *Attorney, Agent, or Firm* — Knobbe, Martens, Olson & Bear, LLP (57) ABSTRACT

According to one embodiment, a semiconductor device includes first and second electrodes, first to third semiconductor regions, and a gate electrode. The first semiconductor region is located on the first electrode. The second semiconductor region is located on the first semiconductor region, and includes a first contact region. The third semiconductor region is located on a portion of the second semiconductor region. The third semiconductor region includes a second contact region. A concentration of a first element in the second contact region is less than a concentration of the first element in the first contact region. The first element is at least one selected from the group consisting of platinum group elements and gold. The gate electrode faces the second semiconductor region via a gate insulating layer. The second electrode is located on the second and third semiconductor regions and contacts the first and second contact regions.

6 Claims, 11 Drawing Sheets

(51) Int. Cl.
   *H10D 30/66*    (2025.01)
   *H10D 64/00*    (2025.01)

(56)                References Cited

U.S. PATENT DOCUMENTS

| 2016/0307993 | A1* | 10/2016 | Kuribayashi | ......... H10D 30/66 |
| 2017/0271324 | A1  | 9/2017  | Kumagai     |                      |
| 2017/0278952 | A1  | 9/2017  | Oka et al.  |                      |
| 2021/0043458 | A1  | 2/2021  | Fujino      |                      |
| 2021/0288158 | A1  | 9/2021  | Shimizu     |                      |
| 2022/0093727 | A1  | 3/2022  | Kondo       |                      |
| 2022/0216310 | A1  | 7/2022  | Kondo       |                      |

FOREIGN PATENT DOCUMENTS

| JP | 2009-272550 A  | 11/2009 |
| JP | 2016-171341 A  | 9/2016  |
| JP | 2017-174989 A  | 9/2017  |
| JP | 2017-175100 A  | 9/2017  |
| JP | 2021-027229 A  | 2/2021  |
| JP | 2021-145112 A  | 9/2021  |
| JP | 2022-051356 A  | 3/2022  |
| WO | 2016/010097 A1 | 1/2016  |

OTHER PUBLICATIONS

Office Action issued in Japanese Patent Application No. 2022-083080, dated Sep. 9, 2025 in 13 pages.

* cited by examiner

SEMICONDUCTOR DEVICE

CROSS-REFERENCE TO RELATED APPLICATIONS

This application is based upon and claims the benefit of priority from Japanese Patent Application No. 2022-083080, filed on May 20, 2022; the entire contents of which are incorporated herein by reference.

FIELD

Embodiments described herein relate generally to a semiconductor device.

BACKGROUND

Semiconductor devices such as metal oxide semiconductor field effect transistors (MOSFETs) and the like are used in applications such as power conversion. It is desirable for the semiconductor devices to have low power consumption.

DETAILED DESCRIPTION

According to one embodiment, a semiconductor device includes a first electrode, a first semiconductor region of an n-type, a second semiconductor region of a p-type, a third semiconductor region of the n-type, a gate electrode, and a second electrode. The first semiconductor region is located on the first electrode. The second semiconductor region is located on the first semiconductor region, and includes a first contact region. The third semiconductor region is located on a portion of the second semiconductor region. The third semiconductor region includes a second contact region. A concentration of a first element in the second contact region is less than a concentration of the first element in the first contact region. The first element is at least one selected from the group consisting of platinum group elements and gold. The gate electrode faces the second semiconductor region via a gate insulating layer. The second electrode is located on the second and third semiconductor regions. The second electrode contacts the first and second contact regions.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

In the following description and drawings, the notations of $n^+$, n, $n^-$, and $p^+$, p, $p^-$ indicate relative levels of the impurity concentrations. In other words, a notation marked with "+" indicates that the impurity concentration is relatively greater than that of a notation not marked with either "+" or "−"; and a notation marked with "−" indicates that the impurity concentration is relatively less than that of a notation without any mark. When both a p-type impurity and an n-type impurity are included in each region, these notations indicate relative levels of the net impurity concentrations after the impurities are compensated.

First Embodiment

Figure 1:
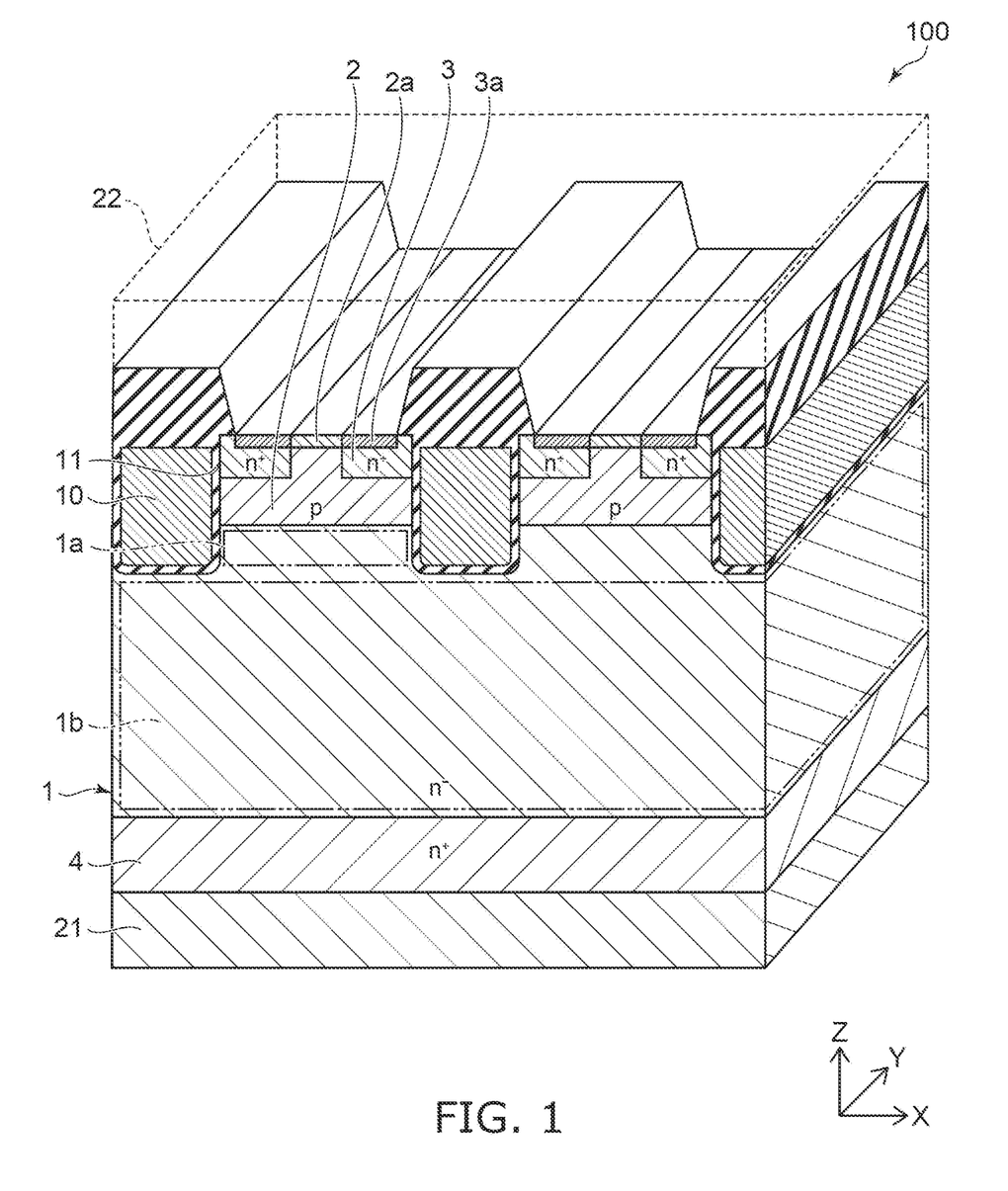
FIG. 1 is a perspective cross-sectional view showing a semiconductor device according to a first embodiment.

FIG. 1 is a perspective cross-sectional view showing a semiconductor device according to a first embodiment.

The semiconductor device according to the first embodiment is a MOSFET. As shown in FIG. 1, the semiconductor device 100 according to the first embodiment includes an $n^-$-type drift region 1 (a first semiconductor region), a p-type base region 2 (a second semiconductor region), an $n^+$-type source region 3 (a third semiconductor region), an $n^+$-type drain region 4, a gate electrode 10, a drain electrode 21 (a first electrode), and a source electrode 22 (a second electrode). In FIG. 1, the source electrode 22 is shown by a broken line.

An XYZ orthogonal coordinate system is used in the description of the embodiments. The direction from the drain electrode 21 toward the drift region 1 is taken as a Z-direction (a first direction). One direction orthogonal to the Z-direction is taken as an X-direction (a second direction). A direction orthogonal to the X-direction and the Z-direction is taken as a Y-direction. Herein, the direction from the drain electrode 21 toward the drift region 1 is called "up", and the opposite direction is called "down". These directions are based on the relative positional relationship between the drain electrode 21 and the drift region 1 and are independent of the direction of gravity.

The drain electrode 21 is located at the lower surface of the semiconductor device 100. The drain region 4 is of the $n^+$-type, is located on the drain electrode 21, and is electrically connected with the drain electrode 21. The drift region 1 is located on the drain region 4.

The drift region 1 is electrically connected with the drain electrode 21 via the drain region 4. The base region 2 is located on the drift region 1. The source region 3 is located on a portion of the base region 2.

The gate electrode 10 faces the base region 2 via a gate insulating layer 11. In the semiconductor device 100, the gate electrode 10 faces the source region 3, the base region 2, and a portion of the drift region 1 via the gate insulating layer 11 in the X-direction.

The source electrode 22 is located on the base region 2 and the source region 3 and is electrically connected with the base region 2 and the source region 3. The gate insulating layer 11 is located between the gate electrode 10 and the source electrode 22; and the source electrode 22 is electrically isolated from the gate electrode 10.

The base region 2 includes a contact region 2a (a first contact region) that contacts the source electrode 22. The source region 3 includes a contact region 3a (a second contact region) that contacts the source electrode 22.

The contact region 2a includes a first element that is at least one selected from the group consisting of platinum group elements and gold. The platinum group elements are at least one selected from the group consisting of ruthenium, rhodium, palladium, osmium, iridium, and platinum. The concentration of the first element in the contact region 2a is greater than the concentration of the first element in the contact region 3a. The contact region 3a may not include the first element. In other words, the concentration of the first element in the contact region 3a may be zero.

The drift region 1, as well as the contact region 2a, may include the first element. For example, the drift region 1 includes a first region 1a that is arranged with the gate electrode in the X-direction, and a second region 1b that is located lower than the first region 1a. The second region 1b is positioned between the drain electrode 21 and the gate electrode 10 in the Z-direction. The first region 1a includes the first element. The concentration of the first element in the first region 1a is greater than the concentration of the first element in the second region 1b. The second region 1b may not include the first element. In other words, the concentration of the first element in the second region 1b may be zero.

The contact region 2a may include a silicide of the first element. The contact region 3a may include a silicide of a metallic element included in the source electrode 22. The contact region 3a does not include a silicide of the first element.

The base region 2, the contact region 2a, the source region 3, the contact region 3a, and the gate electrode 10 each extend in the Y-direction, and pluralities of each are arranged in the X-direction. The source electrode 22 is located on the multiple base regions 2 and the multiple source regions 3 and is electrically connected with the multiple base regions 2 and the multiple source regions 3.

Operations of the semiconductor device 100 will now be described.

A voltage that is not less than a threshold is applied to the gate electrode 10 in a state in which a positive voltage with respect to the source electrode 22 is applied to the drain electrode 21. Thereby, a channel (an inversion layer) is formed in the base region 2; and the semiconductor device 100 is set to the on-state.

Electrons flow from the source electrode 22 toward the drain electrode 21 via the channel. When the voltage that is applied to the gate electrode 10 drops below the threshold, the channel of the base region 2 disappears, and the semiconductor device 100 switches to the off-state.

Examples of the materials of the components of the semiconductor device 100 will now be described.

The drift region 1, the base region 2, the source region 3, and the drain region 4 include a semiconductor material. The semiconductor material is silicon, silicon carbide, gallium nitride, gallium arsenide, etc. Silicon is favorable among these materials.

Arsenic, phosphorus, or antimony can be used as the n-type impurity when silicon is used as the semiconductor material. Boron can be used as the p-type impurity.

The gate electrode 10 includes polysilicon. The gate insulating layer 11 includes an insulating material. For example, the gate insulating layer 11 includes silicon oxide, silicon nitride, or silicon oxynitride. The drain electrode 21 and the source electrode 22 include a metal such as titanium, aluminum, copper, etc.

FIGS. 2A to 4B are cross-sectional views showing a method for manufacturing the semiconductor device according to the first embodiment.

Figure 2A:
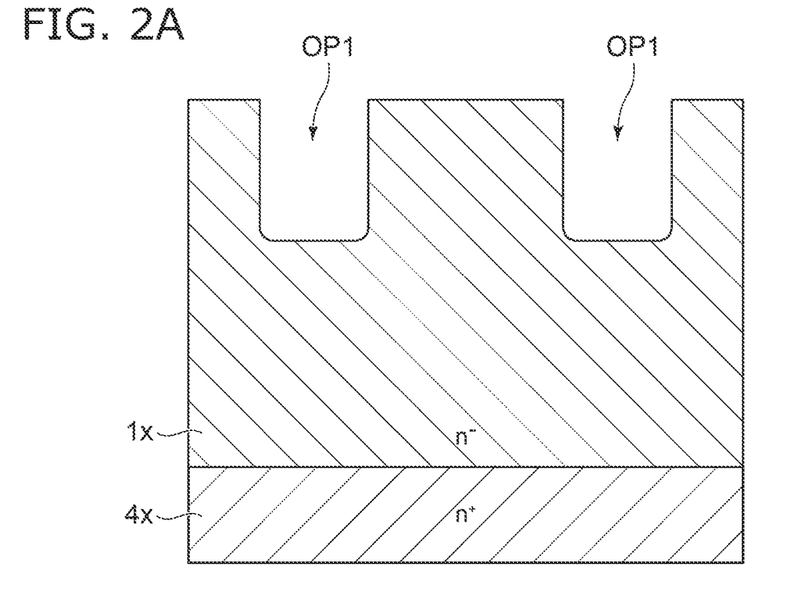
FIGS. 2A and 2B are cross-sectional views showing a method for manufacturing the semiconductor device according to the first embodiment.

First, a semiconductor substrate that includes an $n^+$-type semiconductor layer 4x is prepared. An $n^-$-type semiconductor layer 1x is formed by epitaxially growing a semiconductor material on the $n^+$-type semiconductor layer 4x. As shown in FIG. 2A, an opening OP1 is formed in the $n^-$-type semiconductor layer 1x by removing a portion of the $n^-$-type semiconductor layer 1x by reactive ion etching (RIE). The opening OP1 extends in the Y-direction; and multiple openings OP1 are formed in the X-direction.

Figure 2B:
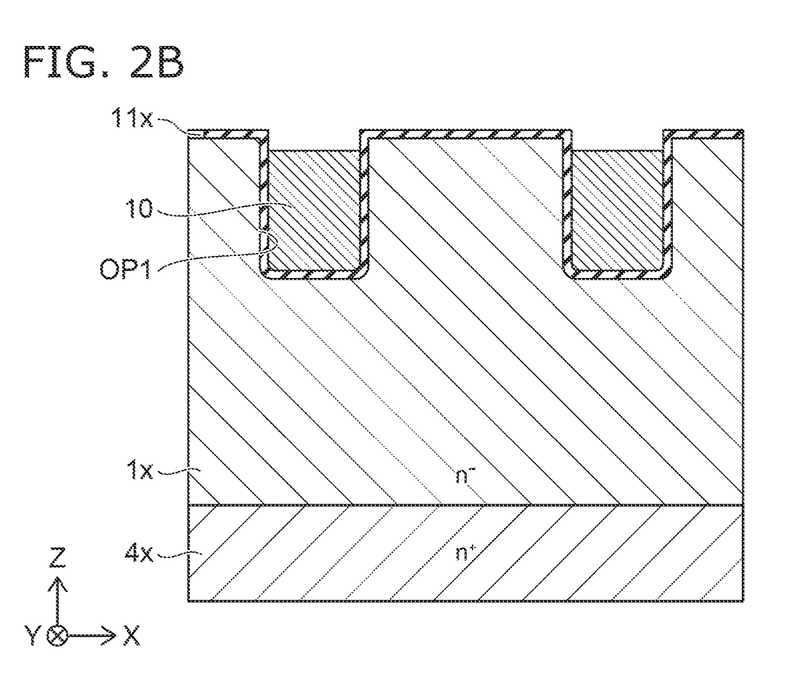

An insulating layer 11x is formed along the inner surface of the opening OP1 and the upper surface of the $n^-$-type semiconductor layer 1x by thermal oxidation. A conductive layer is formed on the insulating layer 11x by chemical vapor deposition (CVD). The upper surface of the conductive layer is caused to recede by chemical dry etching (CDE) or wet etching. Thereby, as shown in FIG. 2B, the gate electrode 10 is formed inside the opening OP1.

Figure 3A:
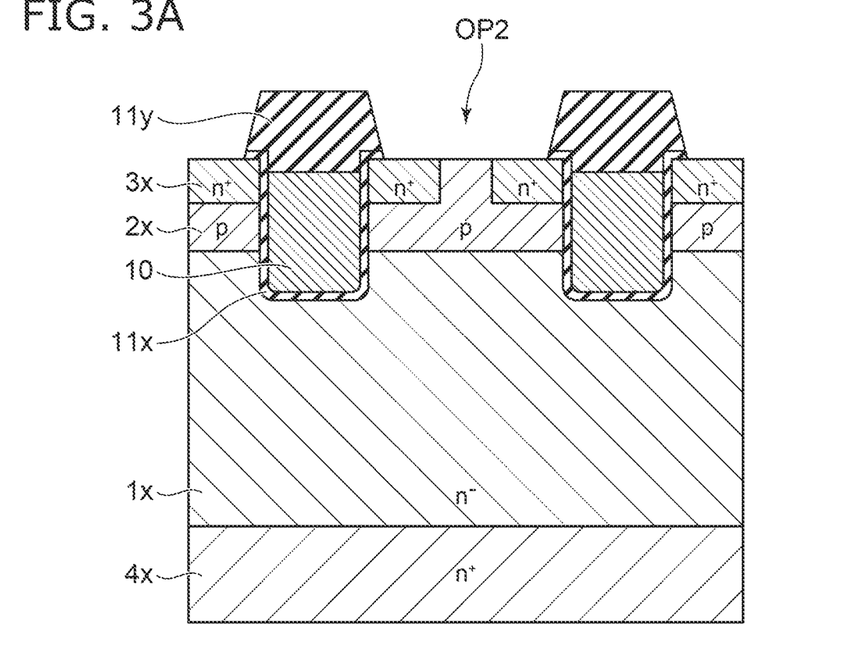
FIGS. 3A and 3B are cross-sectional views showing a method for manufacturing the semiconductor device according to the first embodiment.

A p-type semiconductor region 2x and an $n^+$-type semiconductor region 3x are formed by sequentially ion-implanting a p-type impurity and an n-type impurity into the upper surface of the $n^-$-type semiconductor layer 1x. An insulating layer 11y is formed on the p-type semiconductor region 2x and the $n^+$-type semiconductor region 3x by CVD. As shown in FIG. 3A, an opening OP2 is formed in the insulating layer 11y by removing a portion of the insulating layer 11y by RIE. Portions of the p-type semiconductor region 2x and the $n^+$-type semiconductor region 3x are exposed via the opening OP2.

Figure 3B:
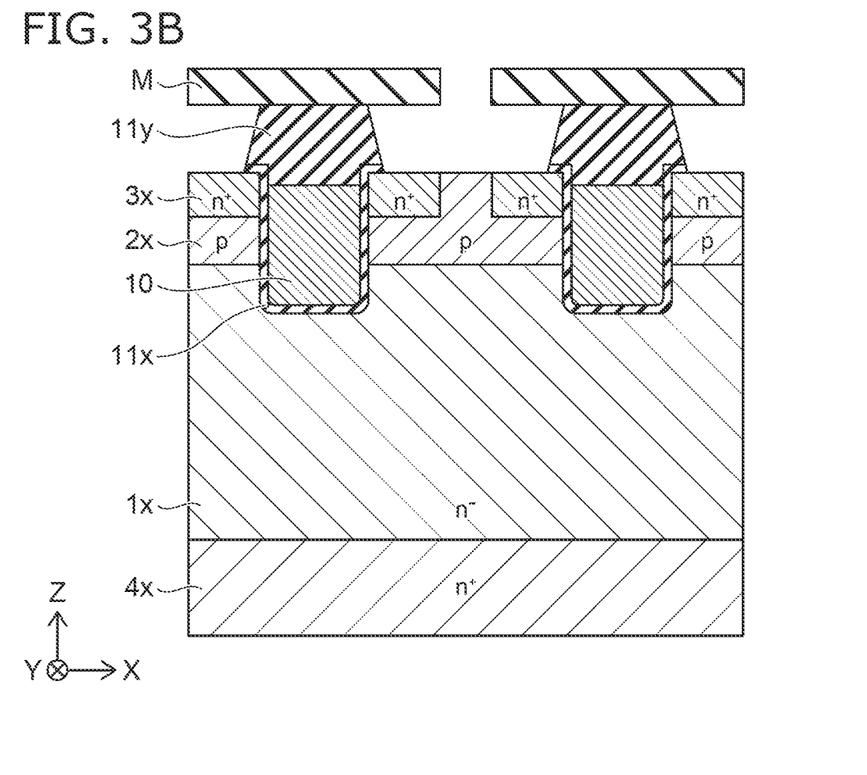

As shown in FIG. 3B, a mask M is formed on the insulating layer 11y. For example, the mask M is a photoresist and is patterned into a prescribed shape by photolithography. The mask M may be a hard mask that includes a metal material or an insulating material. The mask M may be formed along the surface of the insulating layer 11y and the upper surface of the $n^-$-type semiconductor layer 1x. The $n^+$-type semiconductor region 3x is covered with the mask M. At least a portion of the p-type semiconductor region 2x is not covered with the mask M.

The first element is supplied to the p-type semiconductor region 2x in a state in which the $n^+$-type semiconductor region 3x is covered with the mask M. The first element is supplied to the p-type semiconductor region 2x by ion implantation or sputtering. By supplying the first element, a silicide layer 2y is formed in the upper surface of the p-type semiconductor region 2x. The silicide layer 2y includes a silicide of the first element. Also, the first element is diffused into the $n^-$-type semiconductor layer 1x by heat treatment.

As an example, the thickness of the epitaxially-grown $n^-$-type semiconductor layer 1x is 13 µm. The depth of the opening OP1 is 2 µm. The thickness of the p-type semiconductor region 2x is 1.5 μm. After the diffusion by the heat treatment, the concentration of the first element is $1.0×10^{17}/cm^{-3}$ at a depth of about 3 μm from the upper surface of the p-type semiconductor region 2x. The concentration of the first element is $1.0×10^{16}/cm^{-3}$ at a depth of 6 μm from the upper surface of the p-type semiconductor region 2x.

Figure 4A:
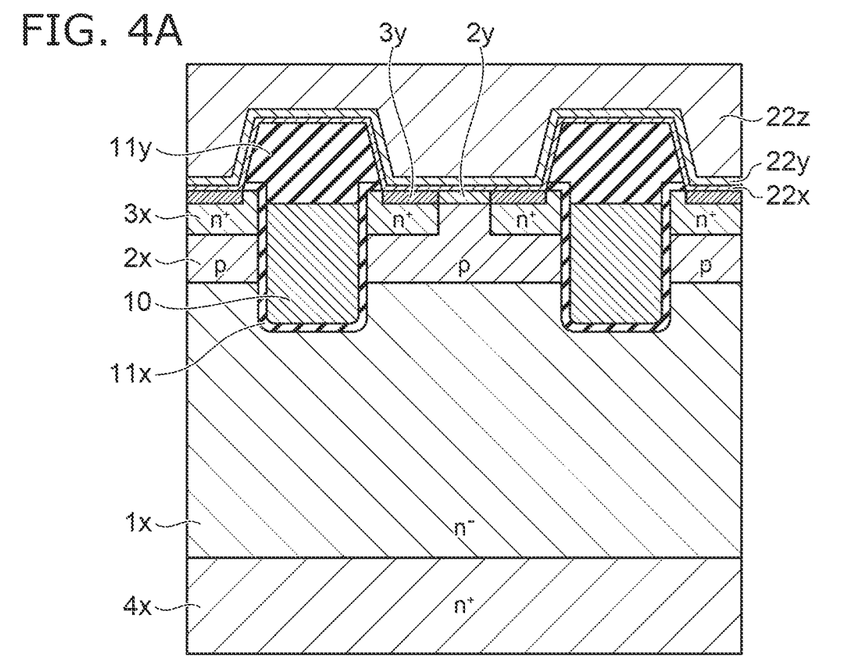
FIGS. 4A and 4B are cross-sectional views showing a method for manufacturing the semiconductor device according to the first embodiment.
Figure 4B:
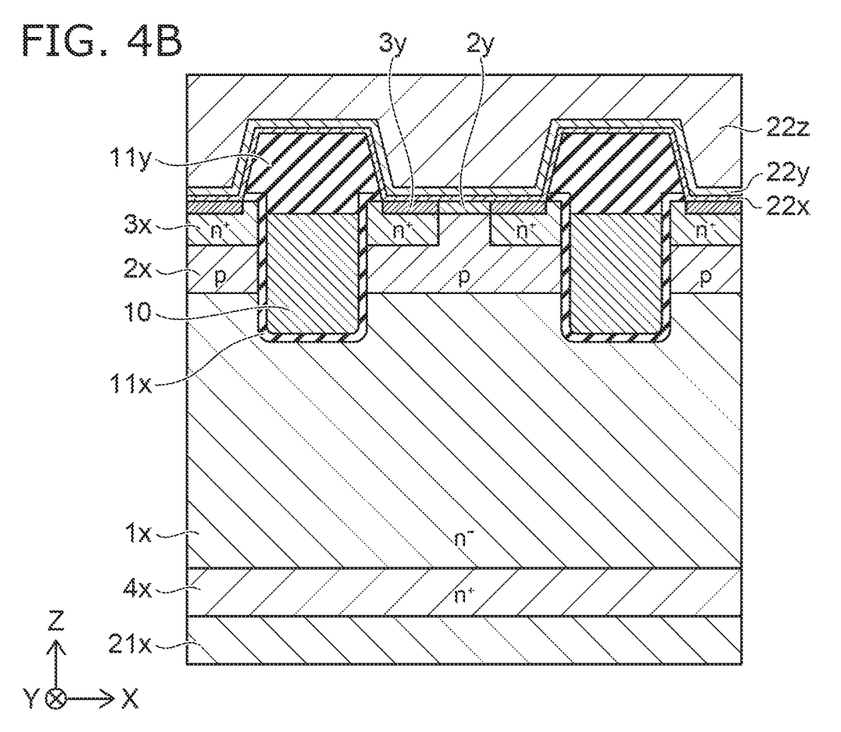

The mask M is removed. As shown in FIG. 4A, metal layers 22x to 22z are sequentially formed on the p-type semiconductor region 2x, the silicide layer 2y, and the n-r-type semiconductor region 3x by sputtering. The metal layer 22x includes titanium. The metal layer 22y is located on the metal layer 22x and includes nitrogen and titanium. The metal layer 22z is located on the metal layer 22y and includes aluminum. The metal layer 22z may further include copper. A silicide layer 3y is formed by the $n^+$-type semiconductor region 3x and the titanium of the metal layer 22x reacting. The lower surface of the $n^+$-type semiconductor layer 4x is polished until the $n^+$-type semiconductor layer 4x has a prescribed thickness. As shown in FIG. 4B, a metal layer 21x is formed on the lower surface of the $n^+$-type semiconductor layer 4x by sputtering aluminum. Thus, the semiconductor device 100 is manufactured.

The $n^-$-type semiconductor layer 1x shown in FIG. 4B corresponds to the drift region 1 of the semiconductor device 100 shown in FIG. 1. The p-type semiconductor region 2x corresponds to the base region 2. The silicide layer 2y corresponds to the contact region 2a. The $n^+$-type semiconductor region 3x corresponds to the source region 3.

The silicide layer 3y corresponds to the contact region 3a. The $n^+$-type semiconductor layer 4x corresponds to the drain region 4. The insulating layers 11x and 11y correspond to the gate insulating layer 11. The metal layer 21x corresponds to the drain electrode 21. The metal layers 22x to 22z correspond to the source electrode 22.

Advantages of embodiments will now be described.

To reduce the switching loss of the semiconductor device 100, it is favorable for the semiconductor region to include the first element. When the semiconductor region includes the first element, the carrier lifetime from generation to disappearance becomes shorter. For example, the carriers that are accumulated in the semiconductor region disappear more quickly when the semiconductor device 100 is turned off, and the switching time of the semiconductor device 100 is reduced. The switching loss of the semiconductor device 100 is reduced thereby, and the power consumption of the semiconductor device 100 is reduced.

In particular, when the contact region 2a includes platinum as the first element, the Schottky barrier for holes between the base region 2 and the source electrode 22 is reduced. The electrical resistance between the base region 2 and the source electrode 22 is reduced thereby, and the power consumption of the semiconductor device 100 is further reduced.

On the other hand, characteristics of the semiconductor device 100 may degrade when the contact region 3a includes the first element. For example, the first element inhibits the reaction between the semiconductor included in the source region 3 and the metal included in the source electrode 22 and increases the electrical resistance between the source region 3 and the source electrode 22. In particular, when the first element is platinum, the semiconductor material and the platinum react and agglomerate with each other. The silicide that is formed by the agglomerate inhibits the formation of the silicide between the semiconductor included in the source region 3 and the metal included in the source electrode 22 and increases the Schottky barrier for electrons.

For this problem, in the semiconductor device 100 according to the embodiment, the concentration of the first element in the contact region 3a is less than the concentration of the first element in the contact region 2a. The degradation of the characteristics of the semiconductor device 100 can be suppressed by setting the concentration of the first element in the contact region 3a to be relatively low. For example, a silicide of the first element is not formed, and the increase of the electrical resistance between the source region 3 and the source electrode 22 is suppressed. By setting the concentration of the first element in the contact region 2a to be relatively high, the carrier lifetime can be reduced, and the switching loss of the semiconductor device 100 can be reduced.

According to the first embodiment, the switching loss of the semiconductor device 100 can be reduced while suppressing the degradation of the characteristics of the semiconductor device 100.

It is favorable for the contact region 2a to include a silicide of the first element. When the contact region 2a includes a silicide of the first element, the electrical resistance of holes between the base region 2 and the source electrode 22 is further reduced. The power consumption of the semiconductor device 100 can be reduced thereby.

It is favorable for the contact region 3a to include a silicide of the metal included in the source electrode 22. When the contact region 3a includes the silicide, the electrical resistance of electrons between the source region 3 and the source electrode 22 is further reduced. The power consumption of the semiconductor device 100 can be reduced thereby.

It is favorable for the drift region 1, as well as the base region 2, to include the first element. By the drift region 1 including the first element, the carriers can disappear more quickly in a wider region of the semiconductor device 100. The switching loss of the semiconductor device 100 can be further reduced thereby. For example, the concentration of the first element in the first region 1a is greater than the concentration of the first element in the second region 1b. The first region 1a is positioned between the gate electrodes 10 in the X-direction.

First Modification

Figure 5:
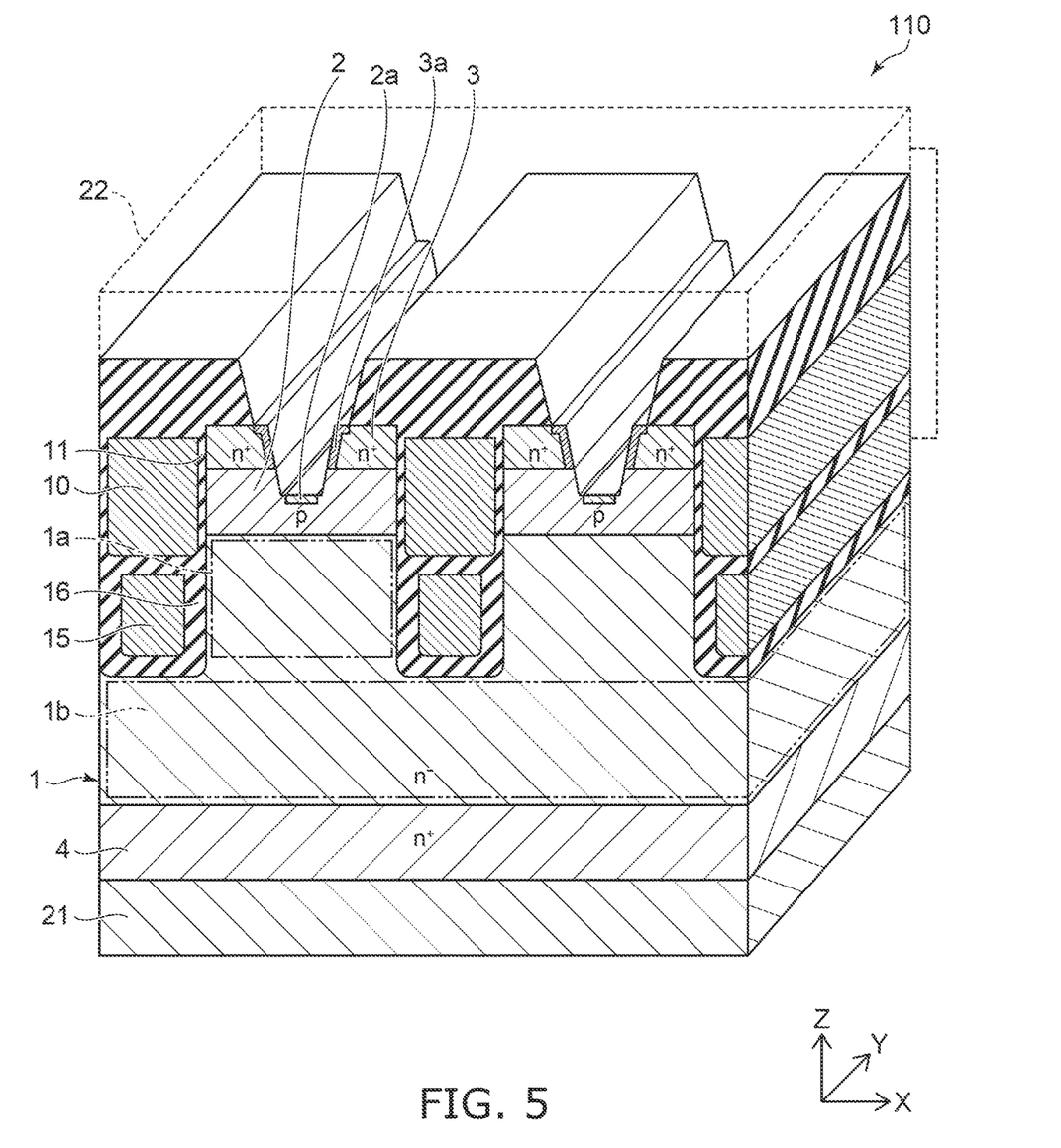
FIG. 5 is a perspective cross-sectional view showing a semiconductor device according to a first modification of the first embodiment.
Figure 6:
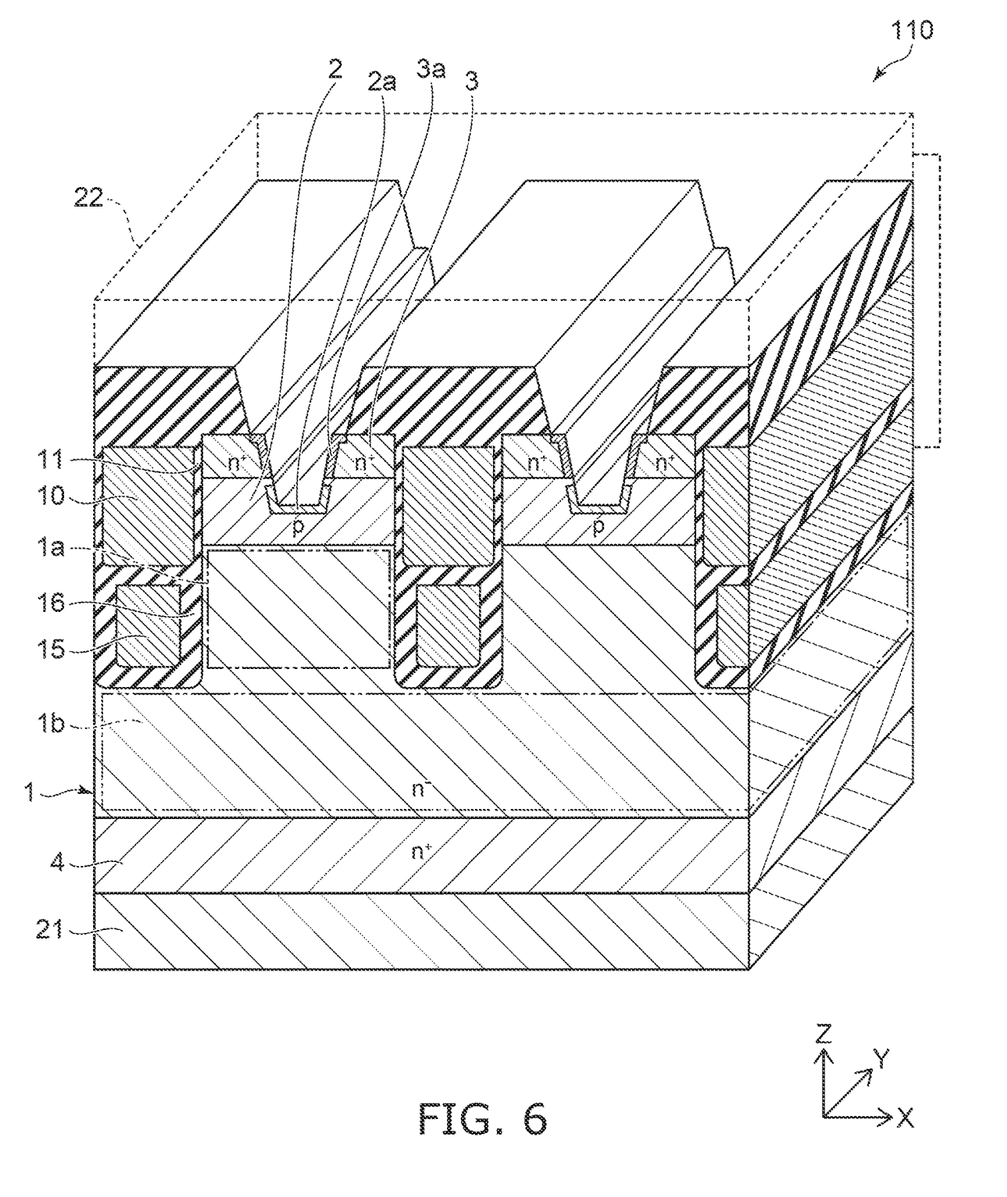
FIG. 6 is a perspective cross-sectional view showing a semiconductor device according to a first modification of the first embodiment.

FIGS. 5 and 6 are perspective cross-sectional views showing a semiconductor device according to a first modification of the first embodiment.

The semiconductor device 110 according to the first modification shown in FIGS. 5 and 6 further includes a conductive part 15. The conductive part 15 is located in the drift region 1 with an insulating layer 16 interposed. At least a portion of the conductive part 15 is positioned lower than the gate electrode 10.

The conductive part 15 extends in the Y-direction; and multiple conductive parts 15 are arranged in the X-direction. For example, the Y-direction end portion of the conductive part 15 is drawn upward and contacts the source electrode 22. The conductive part 15 is electrically isolated from the gate electrode 10.

Or, the conductive part 15 may contact the gate electrode and may be electrically connected with the gate electrode 10. In such a case, the conductive part 15 is electrically isolated from the source electrode 22.

In the semiconductor device 110, a portion of the source electrode 22 extends toward the base region 2. The portion of the source electrode 22 is positioned in the base region 2 and is arranged with a portion of the base region 2 and a portion of the source region 3 in the X-direction.

The contact region 2a is positioned lower than the contact region 3a. For example, as shown in FIG. 5, the contact region 2a spreads in the X-direction along the boundary between the base region 2 and the source electrode 22. As shown in FIG. 6, the contact region 2a may be provided in a wider area. Specifically, a portion of the contact region 2a may be provided along the X-direction, and another portion of the contact region 2a may be provided along a direction oblique to the X-direction.

In the drift region 1, the first region 1a is arranged with the gate electrode 10 and the conductive part 15 in the X-direction. The second region 1b is located lower than the first region 1a and is positioned between the drain electrode 21 and the conductive part 15 in the Z-direction. The concentration of the first element in the first region 1a is greater than the concentration of the first element in the second region 1b.

Figure 7A:
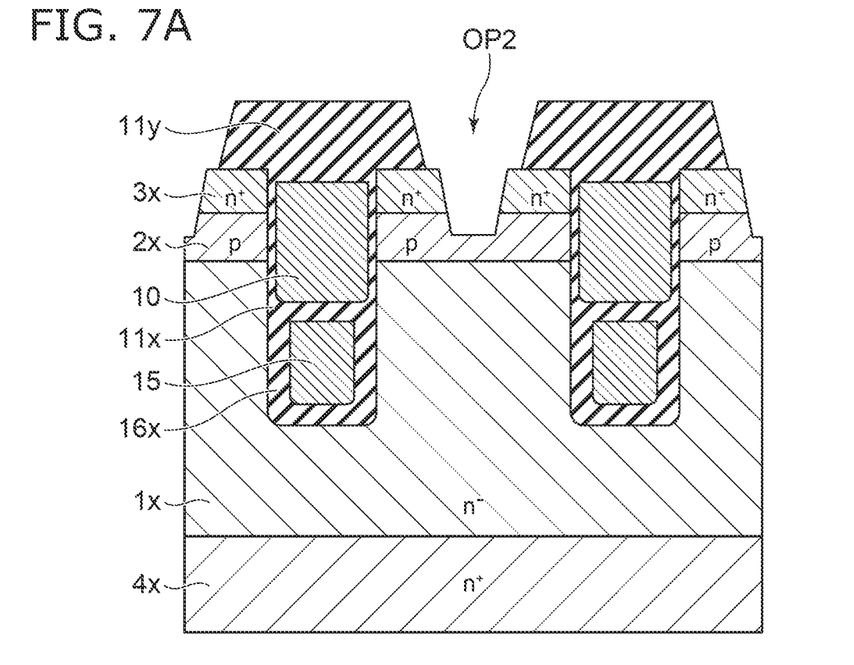
FIGS. 7A and 7B are cross-sectional views showing a method for manufacturing the semiconductor device according to the first modification of the first embodiment.
Figure 7B:
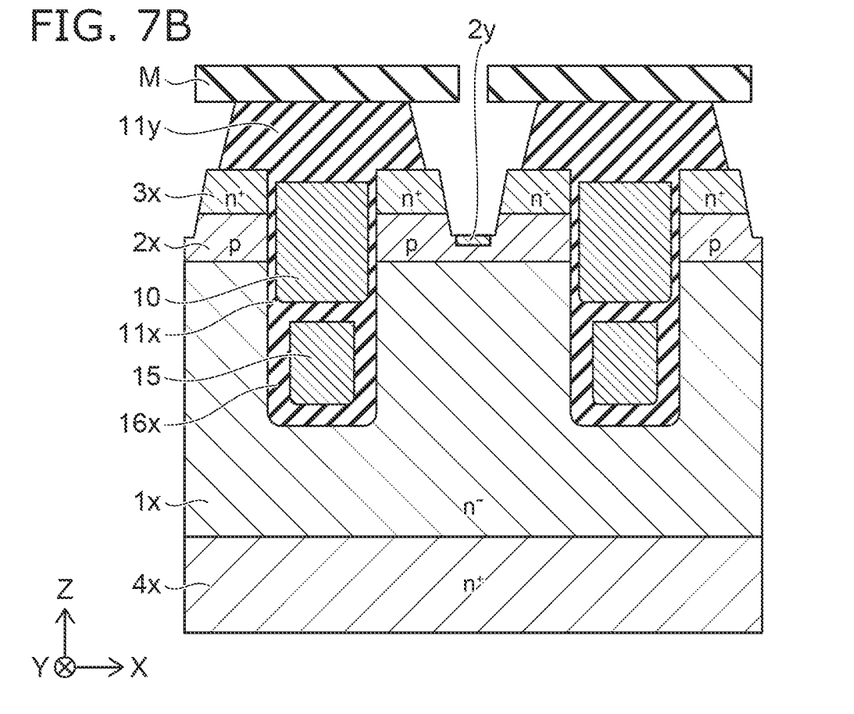

FIGS. 7A and 7B are cross-sectional views showing a method for manufacturing the semiconductor device according to the first modification of the first embodiment.

A process similar to the process shown in FIG. 2A is performed to form the opening OP1 in the n⁻-type semiconductor layer 1x. At this time, the opening OP1 is formed to be deeper than the example shown in FIG. 2A. An insulating layer 16x, the conductive part 15, the insulating layer 11x, and the gate electrode 10 are formed inside the opening OP1. Processes similar to the processes shown in FIG. 3A are performed to form the p-type semiconductor region 2x, the n⁺-type semiconductor region 3x, the insulating layer 11y, etc. Subsequently, when forming the opening OP2, a portion of the n⁺-type semiconductor region 3x and a portion of the p-type semiconductor region 2x are removed in addition to a portion of the insulating layer 11y. As shown in FIG. 7A, the opening OP2 that reaches the p-type semiconductor region 2x is formed thereby.

As shown in FIG. 7B, the mask M is formed on the insulating layer 11y. The n⁺-type semiconductor region 3x is covered with the mask M. At least a portion of the p-type semiconductor region 2x is not covered with the mask M.

The first element is supplied to the p-type semiconductor region 2x by ion implantation or sputtering. For example, the silicide layer 2y can be formed at a portion of the p-type semiconductor region 2x at the bottom portion of the opening OP2 by ion implantation along a direction parallel to the Z-direction, long throw sputtering that has high particle rectilinearity, etc.

Normal sputtering may be performed in which the particle rectilinearity is less than long throw sputtering or oblique rotating ion implantation along a direction oblique to the Z-direction. In such a case, the first element is also supplied to the lower part of the side surface of the opening OP2. As a result, as shown in FIG. 6, the contact region 2a (a silicide layer) is formed along directions oblique to the X-direction.

The processes after FIG. 7B are similar to FIGS. 4A and 4B. The semiconductor device 110 according to the first modification is manufactured by the processes described above.

The positive voltage with respect to the source electrode 22 that is applied to the drain electrode 21 increases when the semiconductor device 110 is switched to the off-state. When the conductive part 15 is included, a depletion layer spreads toward the drift region 1 from the interface between the drift region 1 and the insulating layer 16 due to the potential difference between the conductive part 15 and the drain electrode 21. The breakdown voltage of the semiconductor device 110 can be increased by the spreading of the depletion layer. Or, the n-type impurity concentration in the drift region 1 can be increased to reduce the on-resistance of the semiconductor device 110 while maintaining the breakdown voltage of the semiconductor device 110.

Second Modification

Figure 8:
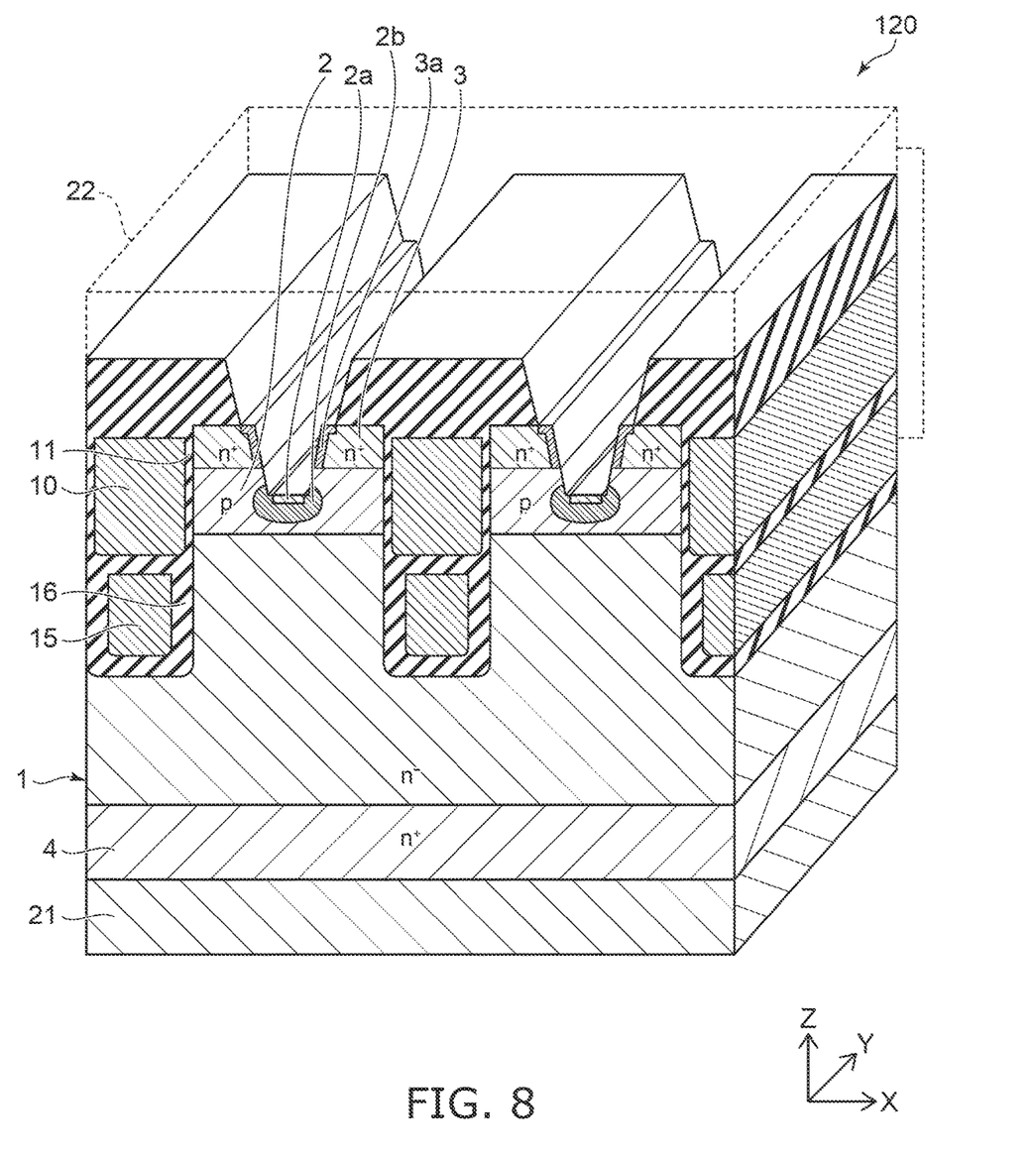
FIG. 8 is a perspective cross-sectional view showing a semiconductor device according to a second modification of the first embodiment.

FIG. 8 is a perspective cross-sectional view showing a semiconductor device according to a second modification of the first embodiment.

Compared to the semiconductor device 110, the semiconductor device 120 according to the second modification has a different base region 2 structure.

In the semiconductor device 120, the base region 2 includes a high-concentration region 2b in addition to the contact region 2a. The p-type impurity concentration of the high-concentration region 2b is greater than the p-type impurity concentration of the other regions. For example, a silicide of the contact region 2a is positioned between the high-concentration region 2b and the source electrode 22.

By providing the high-concentration region 2b, the electrical resistance between the base region 2 and the source electrode 22 can be further reduced. The power consumption of the semiconductor device 120 can be further reduced thereby.

Third Modification

Figure 9:
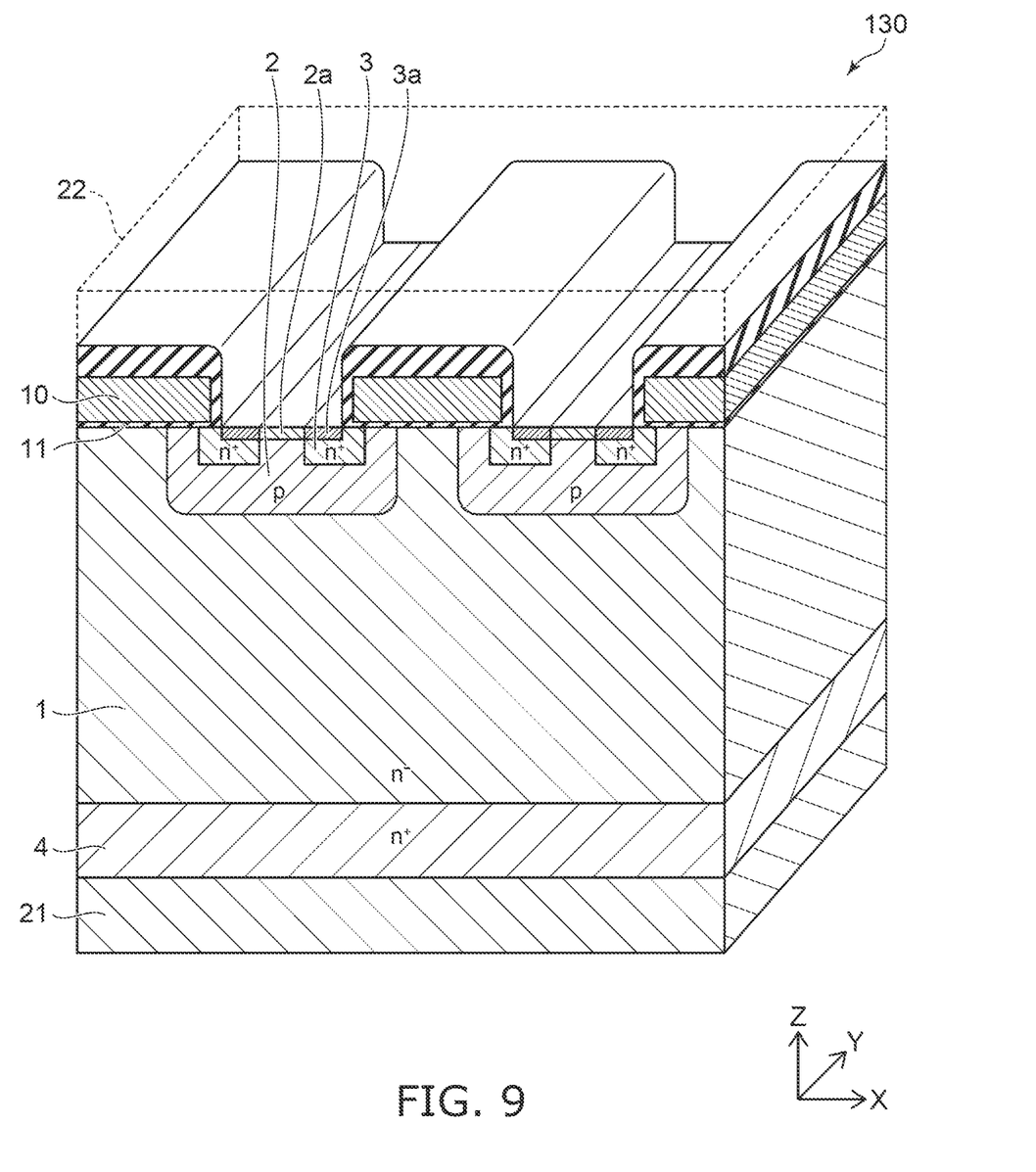
FIG. 9 is a perspective cross-sectional view showing a semiconductor device according to a third modification of the first embodiment.

FIG. 9 is a perspective cross-sectional view showing a semiconductor device according to a third modification of the first embodiment.

In the semiconductor devices 100 to 120, the gate electrode 10 is located in the semiconductor region; and the base region 2 faces the gate electrode 10 via the gate insulating layer 11 in the X-direction. In the semiconductor device 130 according to the third modification shown in FIG. 9, the gate electrode 10 is located on the semiconductor region; and the base region 2 faces the gate electrode 10 via the gate insulating layer 11 in the Z-direction. In the illustrated example, the gate electrode 10 also faces a portion of the drift region 1 and a portion of the source region 3 via the gate insulating layer 11 in the Z-direction.

Other than the positional relationship between the gate electrode 10 and the semiconductor regions, the structure and operation of the semiconductor device 130 are similar to the structure and operation of the semiconductor device 100. For example, the base region 2 and the source region 3 respectively include the contact regions 2a and 3a contacting the source electrode 22. The concentration of the first element in the contact region 3a is less than the concentration of the first element in the contact region 2a.

In the semiconductor device 130 as well, similarly to the semiconductor device 100, the switching loss of the semiconductor device 130 can be reduced while suppressing the degradation of the characteristics of the semiconductor device 130.

Second Embodiment

Figure 10:
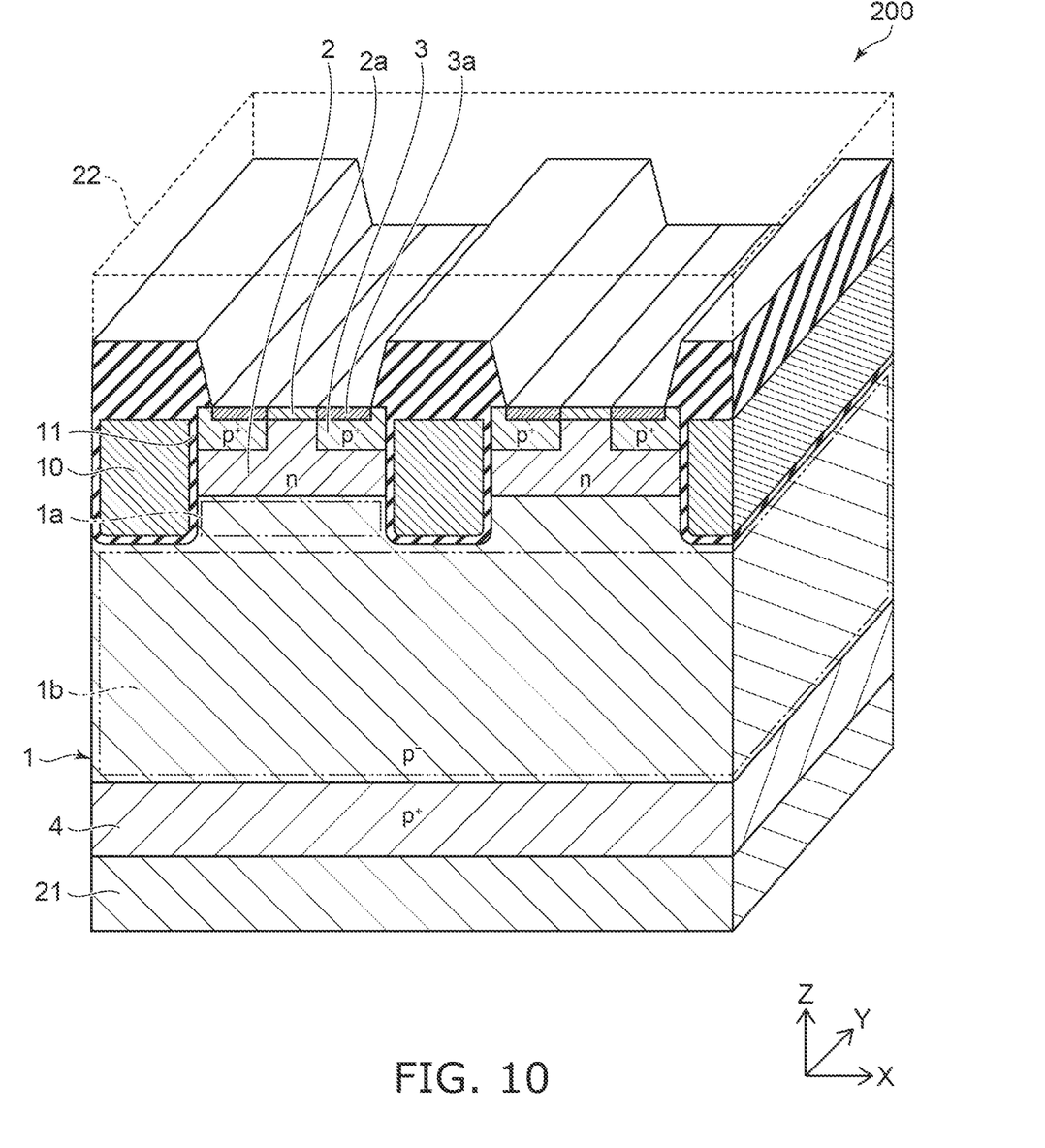
FIG. 10 is a perspective cross-sectional view showing a semiconductor device according to a second embodiment.

FIG. 10 is a perspective cross-sectional view showing a semiconductor device according to a second embodiment.

Compared to the semiconductor device 100, the conductivity types of the semiconductor regions are inverted in the semiconductor device 200 according to the second embodiment shown in FIG. 10. Specifically, the semiconductor device 200 includes the p⁻-type drift region 1 (the first semiconductor region), the n-type base region 2 (the second semiconductor region), the p$^+$-type source region 3 (the third semiconductor region), the p$^+$-type drain region 4, the gate electrode 10, the drain electrode 21 (the first electrode), and the source electrode 22 (the second electrode).

In the semiconductor devices 100 to 130 according to the first embodiment, electrons flow from the source electrode 22 toward the drain electrode 21 in the on-state. In contrast, in the semiconductor device 200, holes flow from the source electrode 22 toward the drain electrode 21 in the on-state. In other words, the semiconductor devices 100 to 130 are n-type MOSs (NMOSs), while the semiconductor device 200 is a p-type MOS (PMOS).

The base region 2 and the source region 3 respectively include the contact regions 2a and 3a. However, in the semiconductor device 200, the concentration of the first element in the contact region 3a is greater than the concentration of the first element in the contact region 2a. The concentration of the first element in the contact region 2a may be zero.

By setting the concentration of the first element in the contact region 3a of the p-type source region 3 to be relatively high, the carrier lifetime can be reduced, and the switching loss of the semiconductor device 200 can be reduced. When the first element is platinum, the Schottky barrier for holes between the source region 3 and the source electrode 22 is reduced, and the power consumption of the semiconductor device 200 is further reduced.

By setting the concentration of the first element in the contact region 2a to be relatively low, the degradation of the characteristics of the semiconductor device 200 can be suppressed. For example, the increase of the electrical resistance between the base region 2 and the source electrode 22 is suppressed.

According to the second embodiment, similarly to the first embodiment, the switching loss of the semiconductor device 200 can be reduced while suppressing the degradation of the characteristics of the semiconductor device 200.

The structures according to the modifications of the first embodiment can also be applied to the semiconductor device according to the second embodiment. For example, similarly to the semiconductor device 110, the semiconductor device 200 may include the conductive part 15. Similarly to the semiconductor device 120, the base region 2 may include a high-concentration region having a higher n-type impurity concentration. Similarly to the semiconductor device 130, the gate electrode 10 may be located on the semiconductor region; and the base region 2 may face the gate electrode 10 via the gate insulating layer 11 in the Z-direction.

Third Embodiment

Figure 11:
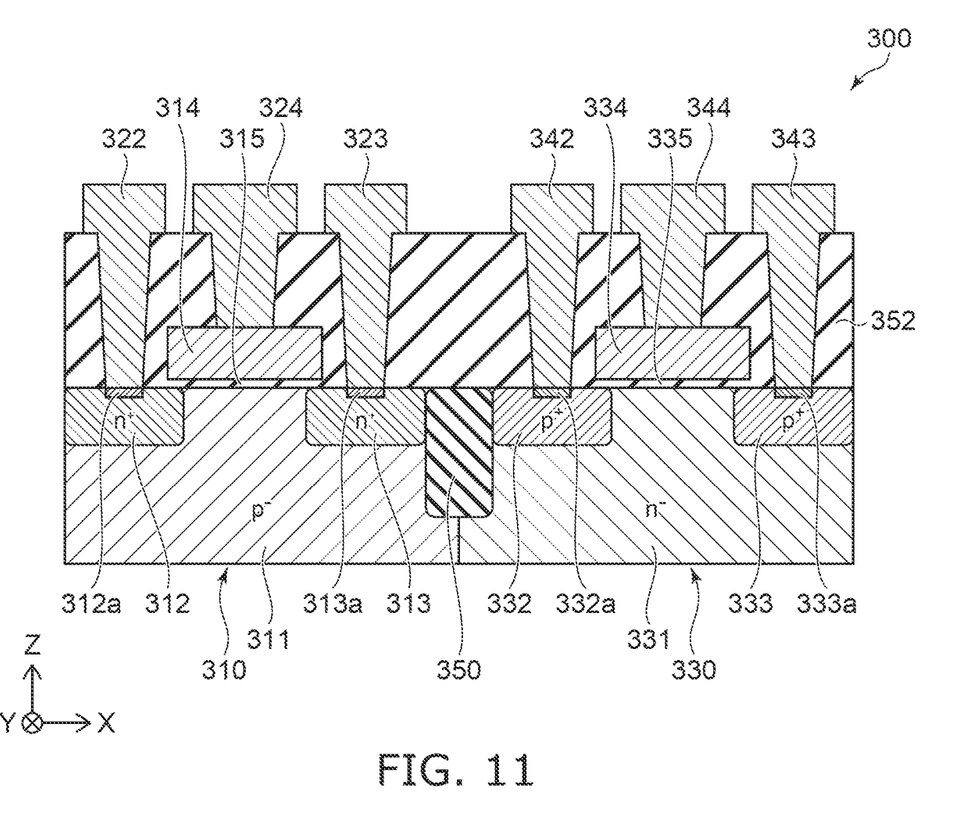
FIG. 11 is a cross-sectional view showing a semiconductor device according to a third embodiment.

FIG. 11 is a cross-sectional view showing a semiconductor device according to a third embodiment.

As shown in FIG. 11, the semiconductor device 300 according to the third embodiment includes an NMOS region 310, interconnects 322 to 324, a PMOS region 330, interconnects 342 to 344, an insulating part 350, and an insulating layer 352. The semiconductor device 300 has a complementary MOS (CMOS) structure.

The NMOS region 310 includes a p$^-$-type semiconductor region 311, an n$^+$-type semiconductor region 312, an n$^+$-type semiconductor region 313, and a gate electrode 314. The n$^+$-type semiconductor regions 312 and 313 are located on the p$^-$-type semiconductor region 311. The n$^+$-type semiconductor region 313 is separated from the n$^+$-type semiconductor region 312. A portion of the p$^-$-type semiconductor region 311 is positioned between the n$^+$-type semiconductor regions 312 and 313. The gate electrode 314 faces the portion of the p$^-$-type semiconductor region 311, a portion of the n$^+$-type semiconductor region 312, and a portion of the n$^+$-type semiconductor region 313 via a gate insulating layer 315.

For example, the direction from the p$^-$-type semiconductor region 311 toward the gate electrode 314 is parallel to the Z-direction. The direction from the n$^+$-type semiconductor region 312 toward the n$^+$-type semiconductor region 313 is parallel to the X-direction.

The interconnect 322 is located on the n$^+$-type semiconductor region 312 and is electrically connected with the n$^+$-type semiconductor region 312. An interconnect 323 is located on the n$^+$-type semiconductor region 313 and is electrically connected with the n$^+$-type semiconductor region 313. The interconnect 324 is located on the gate electrode 314 and is electrically connected with the gate electrode 314. The interconnects 322 to 324 are electrically isolated from each other.

A voltage that is not less than a threshold is applied to the gate electrode 314 in a state in which the potential of the n$^+$-type semiconductor region 312 and the potential of the n$^+$-type semiconductor region 313 are different. Thereby, a channel is formed in the portion of the p$^-$-type semiconductor region 311; and the NMOS region 310 is set to the on-state. Electrons flow via the channel from one of the n$^+$-type semiconductor region 312 or the n$^-$-type semiconductor region 313 to the other of the n$^+$-type semiconductor region 312 or the n$^+$-type semiconductor region 313.

The PMOS region 330 includes an n$^-$-type semiconductor region 331, a p$^+$-type semiconductor region 332, a p$^+$-type semiconductor region 333, and a gate electrode 334. The p$^+$-type semiconductor regions 332 and 333 are located on the n$^-$-type semiconductor region 331. The r-type semiconductor region 333 is separated from the p$^+$-type semiconductor region 332. A portion of the n$^-$-type semiconductor region 331 is positioned between the p$^+$-type semiconductor regions 332 and 333. The gate electrode 334 faces the portion of the n$^-$-type semiconductor region 331, a portion of the p$^+$-type semiconductor region 332, and a portion of the p$^+$-type semiconductor region 333 via a gate insulating layer 335.

The interconnect 342 is located on the p$^+$-type semiconductor region 332 and electrically connected with the p$^+$-type semiconductor region 332. An interconnect 343 is located on the p$^+$-type semiconductor region 333 and electrically connected with the p$^+$-type semiconductor region 333. The interconnect 344 is located on the gate electrode 334 and electrically connected with the gate electrode 334. The interconnects 342 to 344 are electrically isolated from each other.

A voltage that is not less than a threshold is applied to the gate electrode 334 in a state in which the potential of the p$^+$-type semiconductor region 332 and the potential of the p$^+$-type semiconductor region 333 are different. Thereby, a channel is formed in the portion of the n$^-$-type semiconductor region 331; and the PMOS region 330 is set to the on-state. Holes flow via the channel from one of the p$^+$-type semiconductor region 332 or the p$^+$-type semiconductor region 333 to the other of the p$^+$-type semiconductor region 332 or the p$^+$-type semiconductor region 333.

The insulating part 350 is located between at least a portion of the NMOS region 310 and at least a portion of the PMOS region 330 and is positioned between the n$^+$-type semiconductor region 313 and the p$^+$-type semiconductor region 332. The insulating part 350 is formed by local oxidation of silicon (LOCOS) or the like and electrically isolates the NMOS region 310 and the PMOS region 330.

The insulating layer 352 is located on the NMOS region 310, the PMOS region 330, and the insulating part 350. The interconnects 322 to 324 and the interconnects 342 to 344 extend in the Z-direction through the insulating layer 352.

The semiconductor regions of the NMOS region 310 and the PMOS region 330 include a semiconductor material. Silicon is favorable as the semiconductor material. The gate electrodes 314 and 334 include polysilicon. The gate insulating layer 315, the gate insulating layer 335, the insulating part 350, and the insulating layer 352 include an insulating material such as silicon oxide, etc. The interconnects 322 to 324 and the interconnects 342 to 344 include a metal. For example, each interconnect has a stacked structure of a titanium layer, a titanium nitride layer, and a tungsten layer.

The $n^+$-type semiconductor region 312 includes a contact region 312$a$ that contacts the interconnect 322. The $n^-$-type semiconductor region 313 includes a contact region 313$a$ that contacts the interconnect 323. The $p^+$-type semiconductor region 332 includes a contact region 332$a$ that contacts the interconnect 342. The $p^+$-type semiconductor region 333 includes a contact region 333$a$ that contacts the interconnect 343.

The contact regions 332$a$ and 333$a$ include the first element. The concentrations of the first element in the contact regions 332$a$ and 333$a$ are greater than the concentrations of the first element in the contact regions 312$a$ and 313$a$. The concentrations of the first element in the contact regions 312$a$ and 313$a$ may be zero.

For example, the contact region 312$a$ includes a silicide of the metal included in the interconnect 322. The contact region 313$a$ includes a silicide of the metal included in the interconnect 323. The contact regions 332$a$ and 333$a$ each include silicides of the first element.

By setting the concentrations of the first element in the contact regions 332$a$ and 333$a$ to be relatively high, the electrical resistance between the $p^+$-type semiconductor region 332 and the interconnect 342 and the electrical resistance between the $p^+$-type semiconductor region 333 and the interconnect 343 can be reduced. The power consumption of the semiconductor device 300 can be reduced.

By setting the concentrations of the first element in the contact regions 312$a$ and 313$a$ to be relatively low, the degradation of the characteristics of the semiconductor device 300 can be suppressed. For example, an increase of the electrical resistance between the $n^+$-type semiconductor region 312 and the interconnect 322 and the electrical resistance between the $n^+$-type semiconductor region 313 and the interconnect 323 is suppressed.

According to the third embodiment, the power consumption of the semiconductor device 300 can be reduced while suppressing the degradation of the characteristics of the semiconductor device 300.

The impurity concentrations of the semiconductor regions and the concentration of the first element according to the embodiments described above can be measured by, for example, secondary ion mass spectrometry (SIMS). The concentrations of the first element in the multiple regions can also be compared using energy dispersive X-ray analysis (EDX).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first electrode;
   a first semiconductor region located on the first electrode, the first semiconductor region being of an n-type;
   a second semiconductor region located on the first semiconductor region, the second semiconductor region being of a p-type and including a first contact region;
   a third semiconductor region located on a portion of the second semiconductor region, the third semiconductor region being of the n-type and including a second contact region, a concentration of a first element in the second contact region being less than a concentration of the first element in the first contact region, the first element being at least one selected from the group consisting of platinum group elements and gold;
   a gate electrode facing the second semiconductor region via a gate insulating layer; and
   a second electrode located on the second and third semiconductor regions, the second electrode contacting the first and second contact regions, wherein:
   the gate electrode faces the second semiconductor region via the gate insulating layer in a second direction perpendicular to a first direction, and
   the first direction is from the first electrode toward the first semiconductor region; and
   wherein the first semiconductor region includes:
   a first region facing the gate electrode via the gate insulating layer in the second direction; and
   a second region positioned lower than the first region, and
   wherein a concentration of the first element in the first region is greater than a concentration of the first element in the second region.

2. The device according to claim 1, wherein the first contact region includes a silicide of the first element.

3. The device according to claim 2, wherein the second electrode includes a metal, and the second contact region includes a silicide of the metal.

4. The device according to claim 1, further comprising:
   a conductive part located in the first semiconductor region with an insulating layer interposed.

5. The device according to claim 1, wherein the gate electrode faces the second semiconductor region via the gate insulating layer in a first direction, and the first direction is from the first electrode toward the first semiconductor region.

6. The device according to claim 1, wherein the first element is platinum.

* * * * *